(12) United States Patent
Hsiang et al.

(10) Patent No.: US 10,505,070 B2
(45) Date of Patent: Dec. 10, 2019

(54) MICRO DEVICE TRANSFER EQUIPMENT AND RELATED METHOD

(71) Applicant: ACER INCORPORATED, New Taipei (TW)

(72) Inventors: Jui-Chieh Hsiang, New Taipei (TW); Chih-Chiang Chen, New Taipei (TW)

(73) Assignee: ACER INCORPORATED, New Taipei (TW)

( * ) Notice: Subject to any disclaimer, the term of this patent is extended or adjusted under 35 U.S.C. 154(b) by 0 days.

(21) Appl. No.: 15/947,881

(22) Filed: Apr. 9, 2018

(65) Prior Publication Data

US 2019/0214522 A1 Jul. 11, 2019

(30) Foreign Application Priority Data

Jan. 9, 2018 (TW) .............................. 107100811 A

(51) Int. Cl.
*H01L 33/00* (2010.01)
*B25J 18/00* (2006.01)

(52) U.S. Cl.
CPC ............ *H01L 33/005* (2013.01); *B25J 18/00* (2013.01); *H01L 2933/0033* (2013.01); *H01L 2933/0066* (2013.01)

(58) Field of Classification Search
CPC ............... H01L 21/673; H01L 21/6733; H01L 21/67706; B26D 7/0633
See application file for complete search history.

(56) References Cited

U.S. PATENT DOCUMENTS

| | | | | |
|---|---|---|---|---|
| 8,453,548 | B2* | 6/2013 | Jaynes | B26D 1/085 |
| | | | | 83/385 |
| 9,343,365 | B2* | 5/2016 | Lazerand | H01L 21/67069 |
| 2004/0038499 | A1 | 2/2004 | Kim | |
| 2004/0154161 | A1 | 8/2004 | Aoyama | |
| 2007/0138466 | A1* | 6/2007 | Lee | G01R 31/2893 |
| | | | | 257/48 |
| 2017/0186630 | A1* | 6/2017 | Jia | C03B 33/03 |
| 2019/0051762 | A1* | 2/2019 | Yu | H01L 33/44 |

FOREIGN PATENT DOCUMENTS

| | | |
|---|---|---|
| EP | 2 284 862 A1 | 2/2011 |
| JP | 2011-119365 A | 6/2011 |
| JP | 2012-43930 A | 3/2012 |
| TW | M448052 U1 | 3/2013 |

* cited by examiner

*Primary Examiner* — Kaitlin S Joerger
(74) *Attorney, Agent, or Firm* — Winston Hsu

(57) ABSTRACT

A micro device transfer equipment includes a convey platform and a transfer device. The convey platform is configured to carry a wafer and move the wafer towards a specific direction, wherein a plurality of micro devices are fabricated on the wafer. The transfer device includes a plurality of transfer heads each including a base arm, a first side arm and a second side arm. The first side arm and the second side arm are disposed on the base arm in a movable manner for clamping a corresponding micro device among the plurality of micro devices.

7 Claims, 6 Drawing Sheets

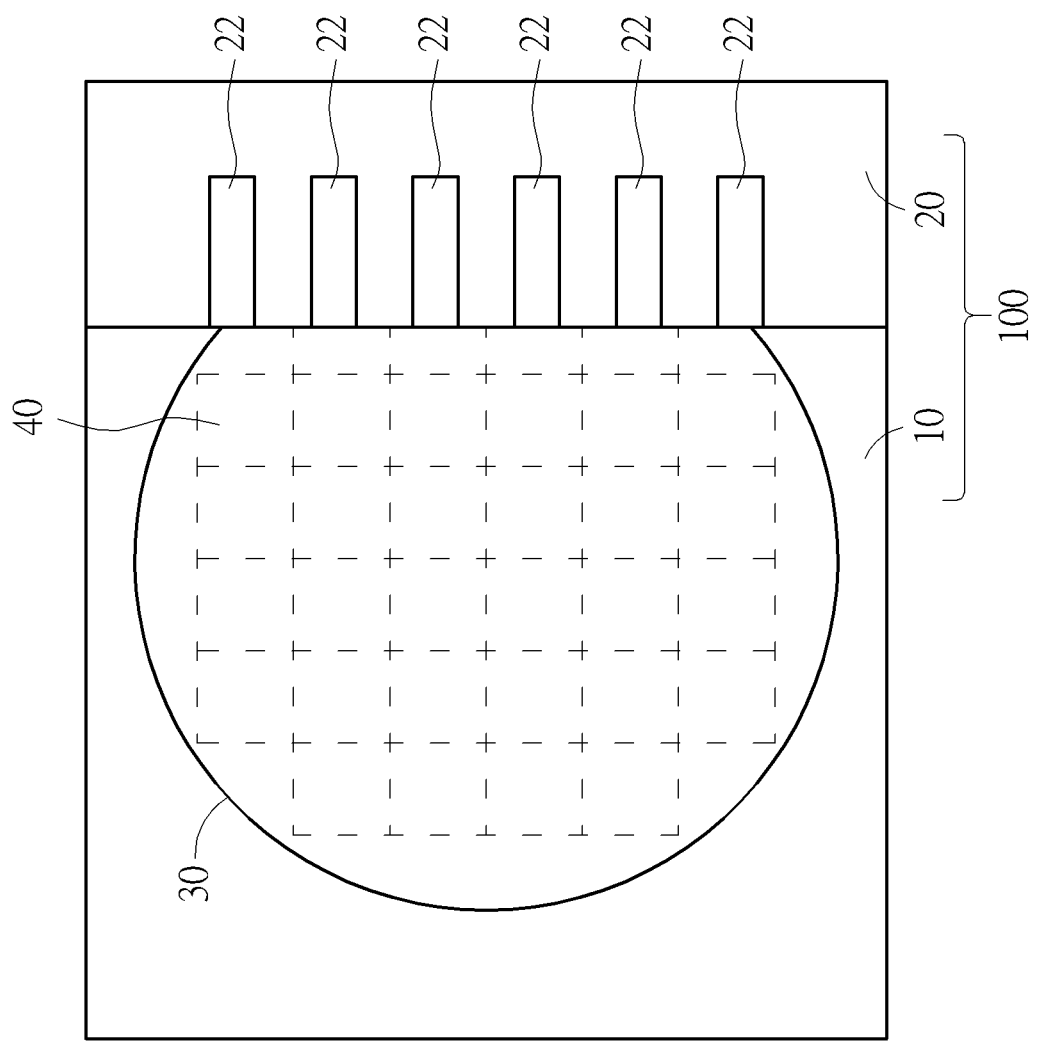

MICRO DEVICE TRANSFER EQUIPMENT AND RELATED METHOD

CROSS REFERENCE TO RELATED APPLICATION

This application claims priority of Taiwan Application No. 107100811 filed on 2018 Jan. 9.

BACKGROUND OF THE INVENTION

1. Field of the Invention

The present invention is related to a micro device transfer equipment and related method, and more particularly, to a micro device transfer equipment and related method capable of mass-transferring micro LEDs rapidly and efficiently.

2. Description of the Prior Art

Compared to traditional incandescent bulbs, light-emitting diodes (LEDs) are advantageous in low power consumption, long lifetime, small size, no warm-up time, fast reaction speed, and the ability to be manufactured as small or array devices. In addition to outdoor displays, traffic signs, and liquid crystal display (LCD) backlight for various electronic devices such as mobile phones, notebook computers or personal digital assistants (PDAs), LEDs are also widely used as indoor/outdoor lighting devices in place of fluorescent of incandescent lamps.

The size of traditional LED arrays is the dimension of millimeters (mm). The size of micro LED arrays may be reduced to the dimension of micrometers ($\mu m$) while inheriting the same good performances regarding power consumption, brightness, resolution, color saturation, reaction speed, life time and efficiency. In a micro LED manufacturing process, a thin-film, miniaturized and array design is adopted so that multiple micro LEDs are fabricated in the dimension of merely 1-250 $\mu m$. Next, these micro LEDs are mass transferred to be disposed on another circuit board. Protection layers and upper electrodes may be formed in a physical deposition process before packaging the upper substrate.

Therefore, there is a need for a micro device transfer equipment capable of mass-transferring micro LEDs rapidly and efficiently.

SUMMARY OF THE INVENTION

The present invention provides a micro device transfer equipment including a convey platform and a transfer device. The convey platform is configured to carry a wafer and move the wafer towards a specific direction, wherein a plurality of micro devices are fabricated on the wafer. The transfer device includes a plurality of transfer heads each having a base arm, a first side arm and a second side arm, wherein the first side arm and the second side arm are disposed on the base arm in a movable manner for clamping a corresponding micro device among the plurality of micro devices.

The present invention also provides method of transferring micro devices including using a convey platform to carry a wafer on which a plurality of micro devices are fabricated; arranging a plurality of transfer heads in a transfer device to be respectively aligned with a first column of micro devices among the plurality of micro devices fabricated on the wafer, or arranging the plurality of transfer heads in the transfer device to be respectively aligned with a first row of micro devices among the plurality of micro devices fabricated on the wafer; adjusting a distance between a first side arm and a second side arm in each transfer head to a first value; the transfer device moving towards the convey platform and the convey platform moving the wafer towards the transfer device until the first column of micro devices or the first row of micro devices are moved into a space between the first side arm and the second side arm of a corresponding transfer head; and adjusting the distance between the first side arm and the second side arm in each transfer head to a second value for clamping each micro device of the first column of micro devices or the first row of micro devices. The first value is larger than a sum of a height of each micro device and a height of the wafer. The second value is smaller than the first value. The first column of micro devices or the first row of micro devices are nearest to the transfer device among the plurality of micro devices fabricated on the wafer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1A-3A and 1B-3B are diagrams illustrating a micro device transfer equipment according to an embodiment of the present invention.

DETAILED DESCRIPTION

Figure 1A:
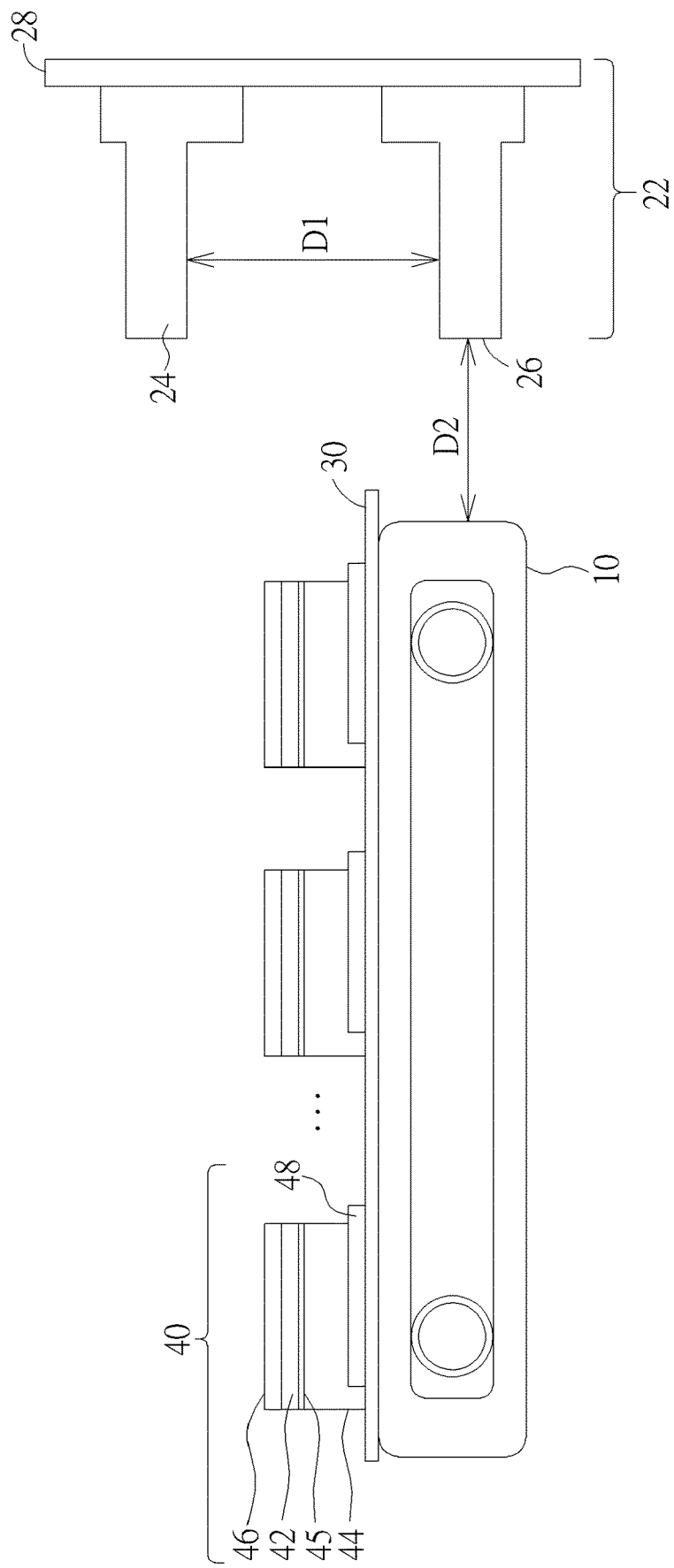

FIGS. 1A-3A and 1B-3B are diagrams illustrating a micro device transfer equipment 100 according to an embodiment of the present invention. FIGS. 1A-3A depict the side-view of the micro device transfer equipment 100 during each operational stage. FIGS. 1B-3B depict the top-view of the micro device transfer equipment 100 during each operational stage.

The micro device transfer equipment 100 includes a convey platform 10 and a transfer device 20 for mass transferring micro devices 40 fabricated on a wafer 30 to another substrate (not shown). In an embodiment of the present invention, the wafer 30 may include an array of micro devices consisting of M columns and N rows (M and N are integers larger than 1). Each micro device 40 may be a micro LED device which includes a P-type semiconductor layer 42, an N-type semiconductor layer 44, a P-electrode 46, an N-electrode 48, and a luminescent layer 45. When a positive voltage is applied to the P-electrode 46 and a negative voltage is applied to the N-electrode 48, electrons flow from the N-region towards the P-region and holes flow from the P-region towards the N-region due to the forward-bias voltage. These electrons and holes then combine in the PN junction of the luminescent layer 45, thereby emitting photons of light. However, the structure of the micro devices 40 does not limit the scope of the present invention.

The convey platform 10 is configured to carry the wafer 30, and the transfer device 20 includes a plurality of transfer heads 22. The amount of the transfer heads 22 is related to the amount of micro devices 40 fabricated on the wafer 30. In an embodiment, the transfer device 20 may include at least N transfer heads 22 for clamping a column of micro devices 40 at each operation. In another embodiment, the transfer device 20 may include at least M transfer heads 22 for clamping a row of micro devices 40 at each operation. However, the amount of transfer heads 50 does not limit the scope of the present invention.

Each transfer head 22 includes an upper side arm 24, a lower side arm 26, and a base arm 28. The upper side arm 24 and the lower side arm 26 are disposed on the base arm 28 in a movable manner, wherein the distance between the upper side arm 24 and the lower side arm 26 may be adjusted according to different operational stages. The convey platform 10 may be a transport belt which can move an item towards a specific direction.

Figure 1B:
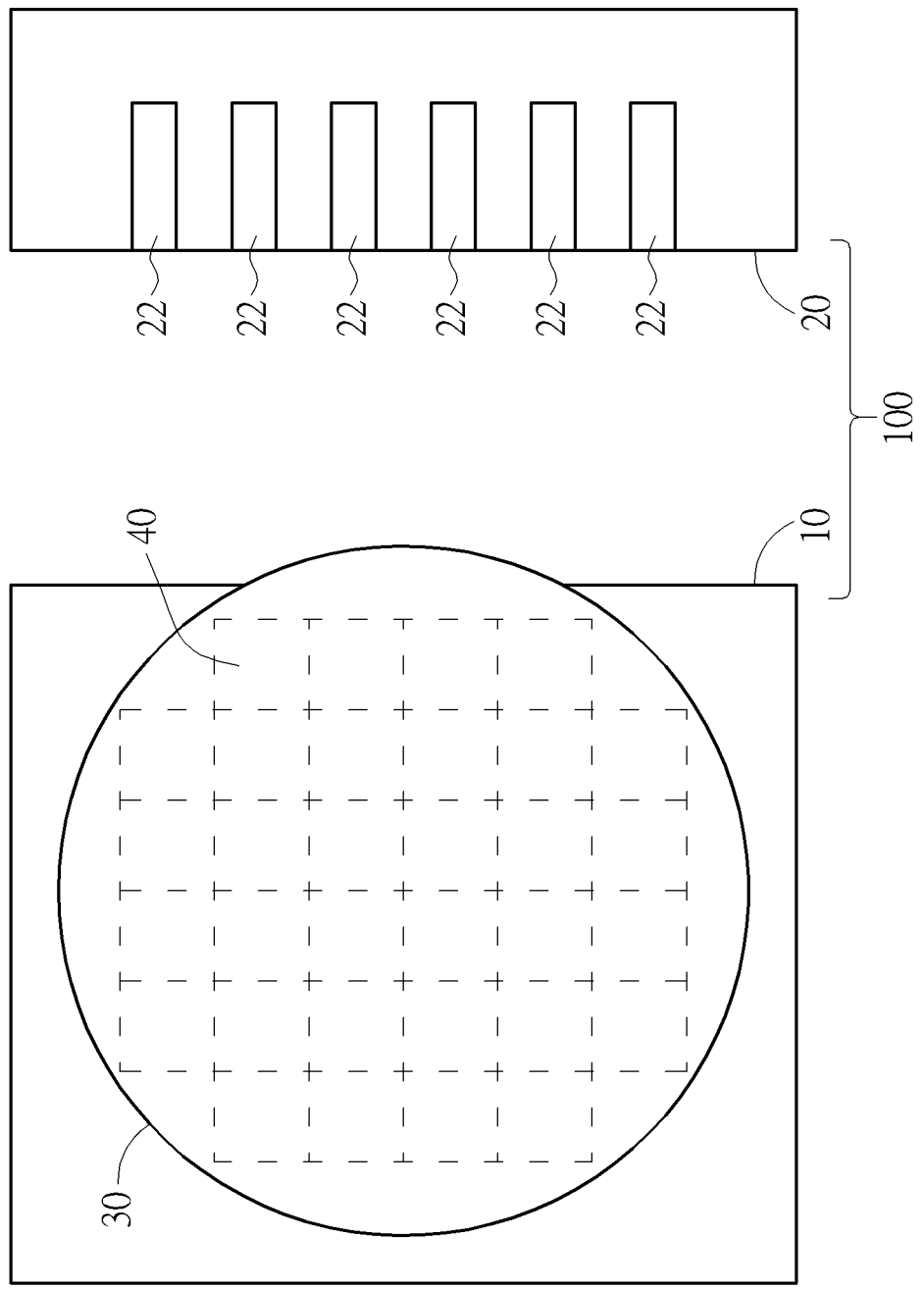

In the initial first stage depicted in FIGS. 1A and 1B, a cutting procedure is first performed on the wafer 40 for defining the range of each micro device 40 (indicated by the dotted line in FIG. 1B). Next, the wafer 30 is disposed on the convey platform 10 in a way that each transfer head 22 is aligned with a corresponding micro device in the first column of micro devices or a corresponding micro device in the first row of micro devices, wherein the first column of micro devices or the first row of micro devices are nearest to the transfer device 40 among the plurality of micro devices 40 fabricated on the wafer 30. In the first stage, the distance between the upper side arm 24 and the lower side arm 26 is D1 and the distance between the convey platform 10 and the transfer device 20 is D2, wherein the value of D1 is larger than the sum of the height of the micro device 40 and the height of the wafer 30.

Figure 2A:
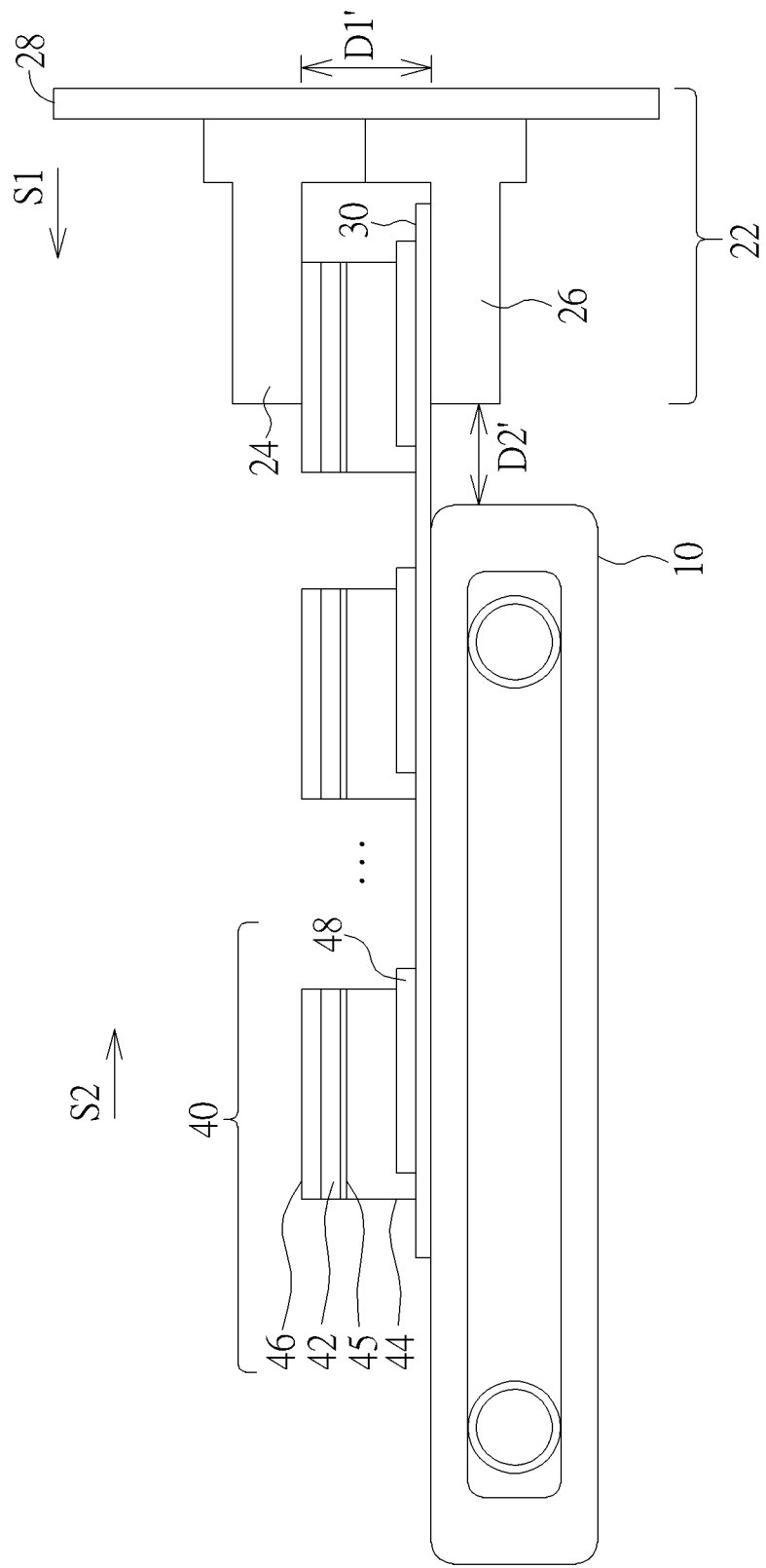

In the second stage depicted in FIGS. 2A and 2B, the transfer device 20 is moved towards the convey platform 10 (indicated by an arrow S1) and the convey platform 10 moves the wafer 30 towards the transfer device 20 (indicated by an arrow S2). The distance between the convey platform 10 and the transfer device 20 now becomes D2' (D2'<D2). Once the first column or the first row of micro devices 40 are moved into the space between the upper side arm 24 and the lower side arm 26 of corresponding transfer heads 22, the transfer device 20 is configured to adjust the distance between the upper side arm 24 and the lower side arm 26 for steadily clamping each micro device 40 of the first column of micro devices 40 or the first row of micro devices 40. The distance between the upper side arm 24 and the lower side arm 26 now becomes D1' (D1'<D1).

Figure 3A:
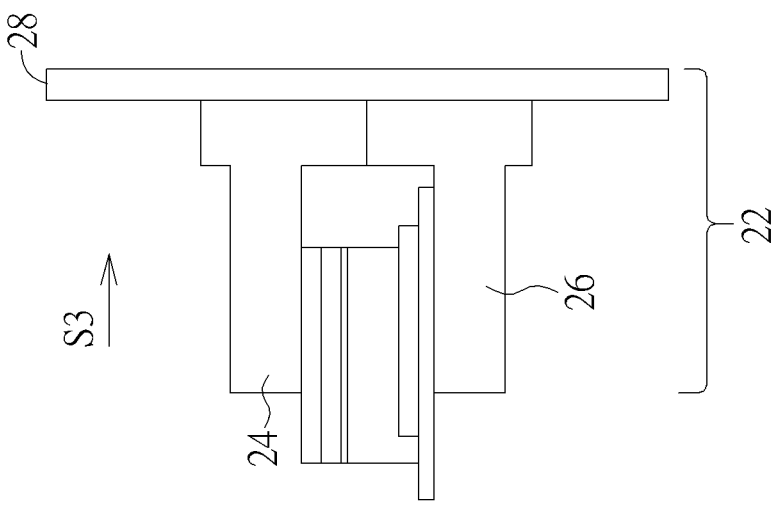
Figure 3A:
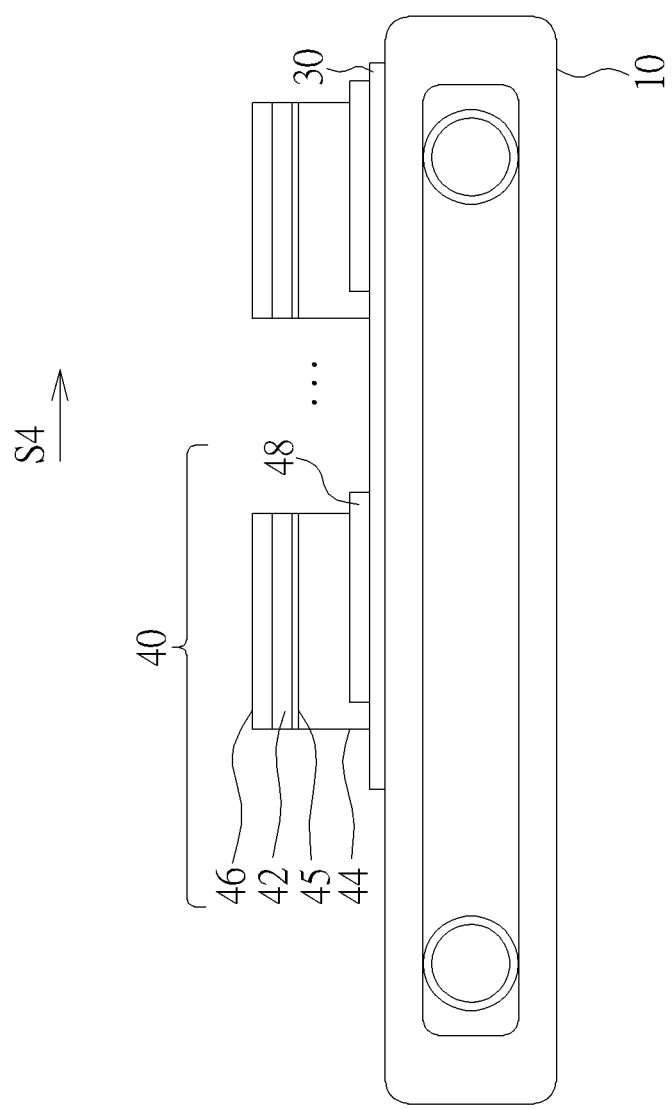
Figure 3B:
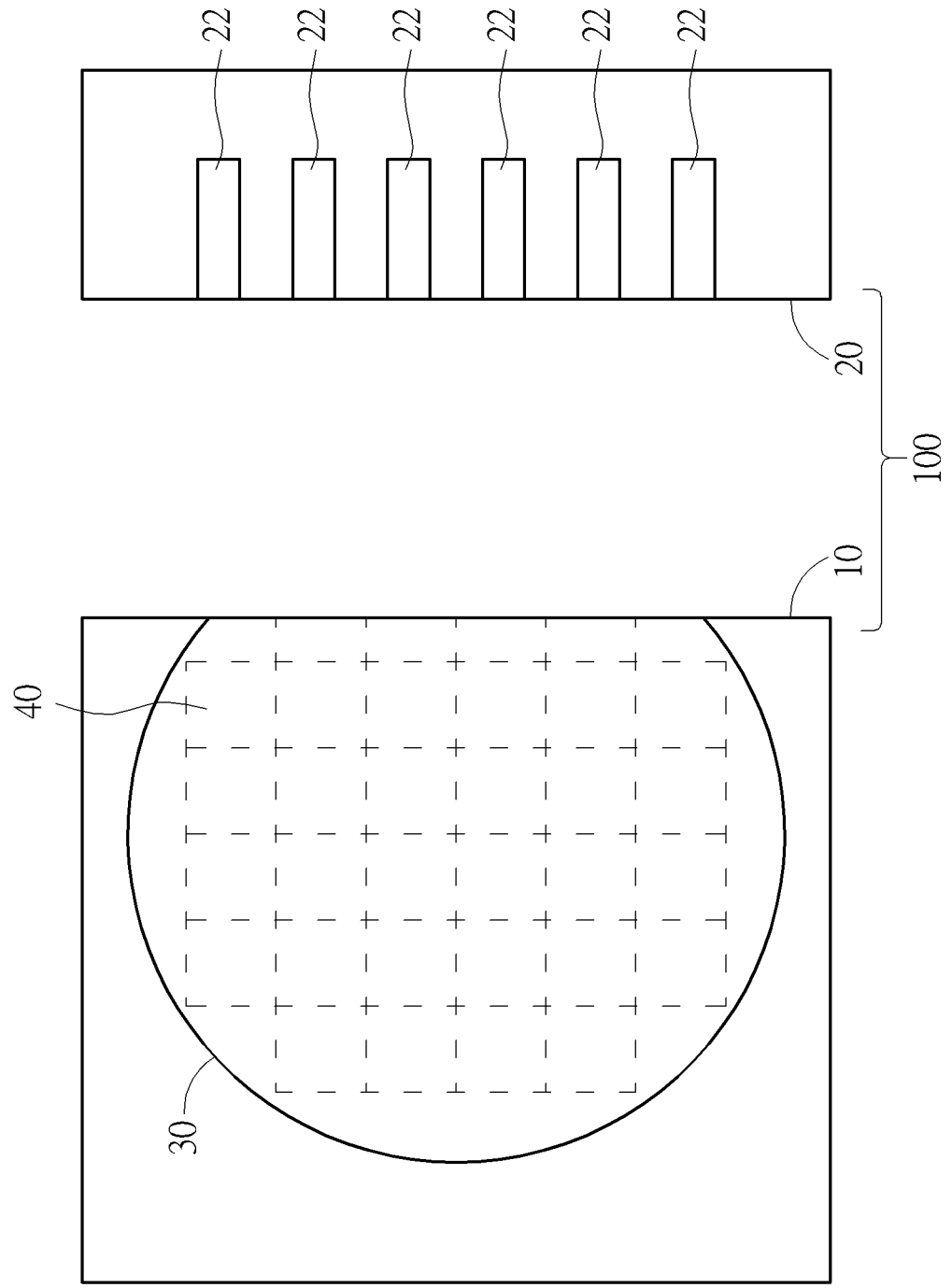

In the third stage depicted in FIGS. 3A and 3B, the transfer device 20 is moved away from the convey platform 10 (indicated by an arrow S3) and the convey platform 10 moves the wafer 30 towards the transfer device 20 (indicated by an arrow S4). Once the transfer device 20 relocates the clamped first column or the first row of micro devices 40 to other locations, the second column or the second row of micro devices 40 may be moved to the edge of the convey platform 10 near the transfer device 20. Therefore, the step illustrated in FIGS. 2A and 2B may be re-executed until all micro devices 40 on the wafer 30 are relocated.

In conclusion, the present invention provides micro device transfer equipment and a related transfer method capable of mass-transferring micro LEDs rapidly and efficiently.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A micro device transfer equipment, comprising:
   a convey platform configured to carry a wafer and move the wafer towards a specific direction, wherein a plurality of micro devices are fabricated on the wafer and each micro device is a micro light emitting diode; and
   a transfer device including a plurality of transfer heads each comprising:
      a base arm; and
      a first side arm and a second side arm disposed on the base arm in a movable manner for clamping a corresponding micro device among the plurality of micro devices.

2. The micro device transfer equipment of claim 1, wherein the convey platform is a transport belt.

3. The micro device transfer equipment of claim 1, wherein the plurality of transfer heads are arranged to be respectively aligned with a first column of micro devices among the plurality of micro devices fabricated on the wafer, or arranged to be respectively aligned with a first row of micro devices among the plurality of micro devices fabricated on the wafer.

4. A method of transferring micro devices, comprising:
   using a convey platform to carry a wafer on which a plurality of micro devices are fabricated, wherein each micro device is a micro light emitting diode;
   arranging a plurality of transfer heads in a transfer device to be respectively aligned with a first column of micro devices among the plurality of micro devices fabricated on the wafer, or arranging the plurality of transfer heads in the transfer device to be respectively aligned with a first row of micro devices among the plurality of micro devices fabricated on the wafer;
   adjusting a distance between a first side arm and a second side arm in each transfer head to a first value;
   the transfer device moving towards the convey platform and the convey platform moving the wafer towards the transfer device until the first column of micro devices or the first row of micro devices are moved into a space between the first side arm and the second side arm of a corresponding transfer head; and
   adjusting the distance between the first side arm and the second side arm in each transfer head to a second value for clamping each micro device of the first column of micro devices or the first row of micro devices, wherein:
      the first value is larger than a sum of a height of each micro device and a height of the wafer;
      the second value is smaller than the first value; and
      the first column of micro devices or the first row of micro devices are nearest to the transfer device among the plurality of micro devices fabricated on the wafer.

5. The method of claim 4, further comprising:
   the transfer device moving away from the convey platform for separating the first column of micro devices or the first row of micro devices from other micro devices fabricated on the wafer after clamping each micro device of the first column of micro devices or the first row of micro devices using each transfer head.

6. The method of claim 5, further comprising:
   the transfer device moving a second column of micro devices or a second row of micro devices fabricated on the wafer towards the transfer device after separating the first column of micro devices or the first row of micro devices from other micro devices fabricated on the wafer, wherein the second column of micro devices or the second row of micro devices are nearest to the transfer device among the plurality of micro devices fabricated on the wafer except the first column of micro devices or the first row of micro devices.

7. The method of claim 4, further comprising:
performing a cutting procedure on the wafer for defining a range of each micro device before using the convey platform to carry the wafer.

* * * * *